United States Patent

[11] 3,599,035

[72] Inventors Kenneth E. Frerichs
Montoursville;
William H. Perkins, Williamsport, both of, Pa.

[21] Appl. No. 400,002
[22] Filed Sept. 29, 1964
[45] Patented Aug. 10, 1971
[73] Assignee Litton Industries, Inc.
Beverly Hills, Calif.

[54] TUNABLE MAGNETRON
16 Claims, 2 Drawing Figs.

Figure 1:
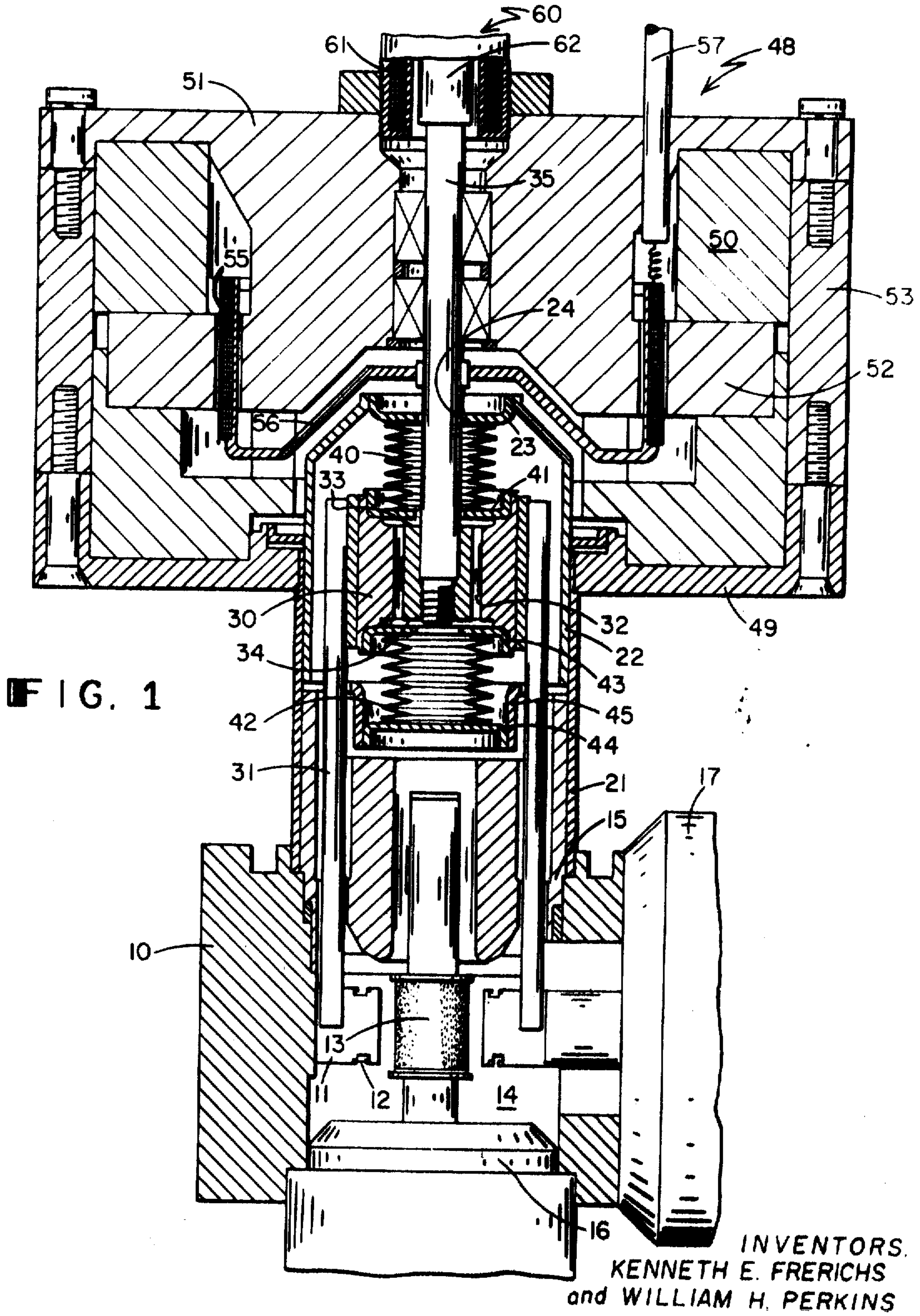

[52] U.S. Cl. .......... 315/39.59, 315/39.61, 333/83
[51] Int. Cl. .......... H01j 25/50
[50] Field of Search .......... 315/5.21, 5.46, 5.47, 5.53, 39.59, 39.61; 333/83

[56] References Cited

UNITED STATES PATENTS

| | | | |
|---|---|---|---|
| 2,621,311 | 12/1952 | LaRue | 315/39.61 X |
| 3,032,681 | 5/1962 | Scanzani | 315/39.61 |

*Primary Examiner*—Herman Karl Saalbach
*Assistant Examiner*—Paul L. Gensler
*Attorneys*—Robert H. Lentz, Alan C. Rose, Alfred B. Levine and Ronald W. Reagin ABSTRACT: A tunable resonant cavity device is provided which contains a pair of metal bellows connected in tandem with one end of each bellows anchored to fixed spaced locations within the body of the device. One fixed end of one bellows is sealed closed, whereas the other fixed end contains an opening through which one mechanical element in the tuning mechanism extends. The bellows are joined in tandem by a moveable member to which an end of each bellows is sealed. The moveable member contains a passage which extends therethrough to permit equalization of pressure on each side thereof and between the bellows. Another mechanical element of the tuning mechanism is connected to this moveable member along its periphery on the outside of the bellows. The mechanical movement of an external tuner mechanism is transmitted through a coupling to one of the aforementioned tuning elements, the tandem bellows to the other mechanical element and in so doing causes one of the bellows to be compressed and the other to expand although the total volume enclosed by the tandem connected bellows is substantially constant. The other mechanical element is coupled to the tuning element located in the sealed evacuated resonant cavity which is sealed closed by the tandem bellows structure. Inasmuch as the pressure on each side of the moveable member is equal, the vacuum force due to differential pressure between the outside and the inside of the evacuated cavity is canceled.

INVENTORS.
KENNETH E. FRERICHS
and WILLIAM H. PERKINS

BY David M. Keay

AGENT.

INVENTORS.
KENNETH E. FRERICHS
and WILLIAM H. PERKINS

BY David M Keay

AGENT.

TUNABLE MAGNETRON

This invention relates to tunable magnetrons. More particularly, it is concerned with structure for transmitting motion from the exterior to elements of the tuning mechanism within the sealed, evacuated chamber of a magnetron.

The frequency of tunable magnetrons is commonly varied by a tuning member within the evacuated chamber of the magnetron which is moved relative to the resonant cavity structure of the magnetron so as to change the frequency of resonance. This tuning member is sealed to the walls of the evacuated chamber by a flexible bellows which provides a hermetic seal between the walls and the tuning member while permitting movement of the member. An arrangement for driving the tuning member is coupled to the tuning member at a portion of the member exposed to the atmosphere exterior of the chamber.

For certain applications the output frequency of a magnetron is varied rapidly and continually over the tuning range of the magnetron in accordance with electrical tuning signals. In order to provide sufficient force to drive the tuning member a hydraulic servosystem controlled by the electrical signals is commonly used. Hydraulically tuned magnetrons are, of course, limited to operation in conjunction with equipment having a hydraulic system. In addition, the tuner actuating section of the magnetron must be of sufficient size and strength to contain the tuner drive, channels for selectively applying hydraulic fluid under pressure to the tuner drive, and high pressure sealing arrangements for containing the fluid while permitting movement of the parts of the tuner mechanism.

Various other systems for driving the tuning member have been proposed. Electromagnetic arrangements which utilize the electrical tuning signals directly or after amplification have been mounted within the evacuated chamber of the magnetron. With such a tuning mechanism it is unnecessary to transmit motion through the walls of the chamber by means of a flexible bellows. However, these arrangements require that moving parts and bearings as well as electrical coils be mounted within the chamber prior to evacuation and sealing. Since these processing steps require high temperatures, it is extremely difficult to protect the tuning mechanism from being damaged.

Electromagnetic tuner driving arrangements located exterior of the evacuated chamber and transmitting motion to the interior of the chamber by means of a flexible bellows have not been capable of supplying sufficient force to move the tuning member through the amplitudes and at the frequencies desired. The force provided must be sufficient to overcome the force due to atmospheric pressure acting on the exterior surfaces of a moving tuning member while other surfaces of the moving member are within the evacuated chamber. Counteracting springs acting to oppose atmospheric pressure have been employed with electromagnetic tuning arrangements and also with hydraulic systems in order to decrease the force which must be applied to the tuner and thus enable the tuning frequency to be increased. However, in addition to the complications of mounting the springs there are problems in that the force of the springs varies with the position of the moving tuning member and the atmospheric pressure which the springs are intended to overcome varies with altitude.

It is an object of the present invention, therefore, to provide an improved tunable magnetron.

It is a more specific object of the invention to provide an improved structure for transmitting motion from exterior of the sealed chamber of a resonant cavity device to a tuning element located within the chamber which structure avoids the necessity for overcoming the force of atmospheric pressure.

It is also an object of the invention to provide an electromagnetically tuned magnetron capable of being rapidly and continually tuned through a range of output frequencies.

Briefly, in accordance with the foregoing objects of the invention structure is provided for transmitting motion from exterior of the sealed chamber of a resonant cavity device to a tuning element located within the chamber through an opening in the walls of the body of the device and for sealing the opening to seal the chamber from the atmosphere exterior of the chamber. The structure includes a moveable member which has two opposed surfaces and a surface region between the two surfaces and is located adjacent the opening. A passage extends through the member between the two opposed surfaces. One end of a first sealing means encircles the passage and a surface region of the moveable member and makes sealing contact to one of the opposed surfaces of the member. The opposite end of the first sealing means encircles the opening in the walls of the body and makes sealing contact to the walls. One end of a second sealing means which is similar to the first encircles the passage and makes sealing contact to the other of the opposed surfaces of the moveable member. The opposite end of the second sealing means makes sealing contact to an impervious member which is fixed with respect to the body of the device. The two sealing means permit limited movement of the moveable member with respect to the body. The resonant frequency of the cavity is varied by movement of a tuning element located within the chamber. The tuning element is fixed to one of the aforementioned surface regions of the moveable member which is within the chamber. A tuner driving means is coupled to the moveable member at the other of the aforementioned surface regions which is exterior of the chamber.

With this structure the opposite surfaces of moving parts are subject to equal pressures in the direction of movement of the parts. The volume of the sealed chamber remains substantially constant regardless of the position of the moveable member. Thus, the tuner driving arrangement is not required to provide the force which was necessary in prior art devices to overcome atmospheric pressure acting in opposition to the movement of the parts of the tuning mechanism.

Figure 2:
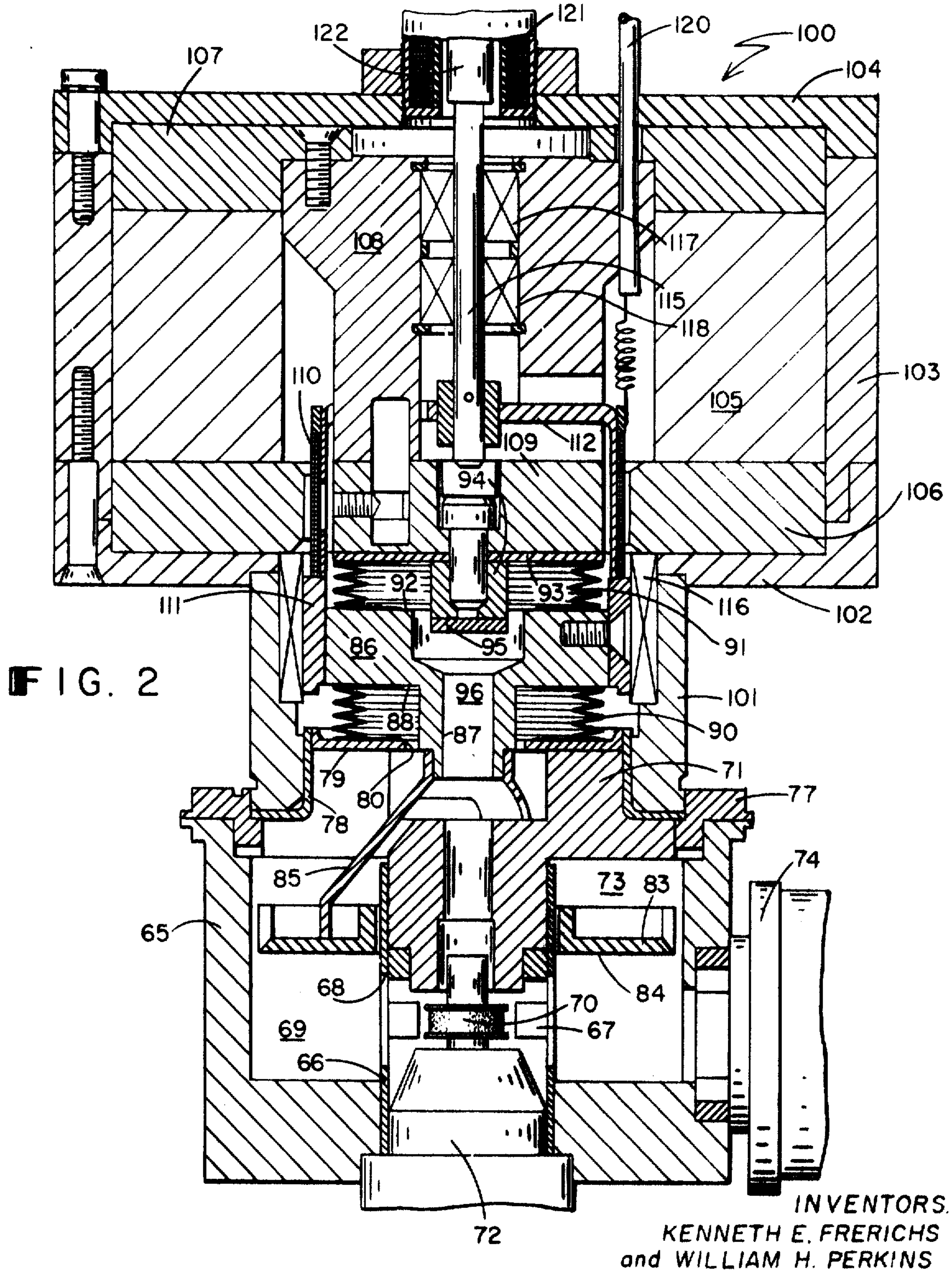

Additional objects, features, and advantages of the invention will be apparent from the following detailed discussion and the accompanying drawings wherein:

FIG. 1 is a fragmentary elevational view partially in cross section illustrating one aspect of the invention embodied in a strapped vane magnetron, and FIG. 2 is a fragmentary elevational view partially in cross section illustrating a modification of the invention embodied in a coaxial magnetron.

The magnetron incorporating the first modification of the invention as illustrated in FIG. 1 includes a cylindrical anode block 10 which constitutes a portion of the body of the device. A plurality of vanes 11 extend radially inward from the block to provide a plurality of cavity resonators lying in a circular array about the central axis of the device. The anode is strapped with pairs of concentric metal rings 12 located in recesses in each end of the vanes. Each strapping ring is connected only to alternate vanes in the manner well known in the art to insure operation of the magnetron in the $\pi$ mode. An electron emissive cathode 13 is positioned centrally of the anode and spaced from the tips of the vanes. The anode vanes and the cathode are located within a sealed, evacuated chamber 14. Upper and lower pole pieces 15 and 16 are arranged to direct a magnetic field from permanent magnets (not shown) through the interaction space of the device. The cathode passes through a bore (not shown) in the lower pole piece. The lower end of the chamber is hermetically sealed by a suitable sealing arrangement between the anode block, lower pole piece, and cathode. Electromagnetic energy is coupled from the magnetron by an output coupler 17 extending through the anode block and communicating with one of the cavity resonators.

The upper pole piece 15 is encircled by a cylindrical sleeve 21 sealed to the anode block 10. The sleeve 21 is sealed to a cylindrical body member 22 which in turn is sealed to a flanged plate 23. An opening 24 in the plate 23 is located along the central axis of the magnetron. The block 10, cylindrical sleeve 21, body member 22, and plate 23 constitute the major portion of the walls of the chamber 14, and the opening 24 provides access to the chamber for the tuner mechanism.

The tuner mechanism includes a moveable tuning member 30 to the outer periphery of which is fixed a plurality of tuning pins 31. Each tuning pin has a long cylindrical body and a flat end face or plunger portion as illustrated in FIG. 1. Each tuning pin 31 extends through an opening in the upper pole piece 15 and into a cavity resonator formed by a pair of vanes 11. Movement of the moveable tuning member 30 along the direction of the axis of the device causes the tuning pins to move into and out of the cavity resonators thereby changing the frequency of resonance of the resonators.

Passages 32 extend through the moveable tuning member 30 between its upper and lower surfaces 33 and 34. A tuner driving rod 35 is fixed to the moveable member 30 and extends from the upper surface axially of the magnetron. The rod extends beyond the walls of the evacuated chamber through the opening 24 in the flanged plate 23.

One end of a cylindrical, flexible bellows 40 is sealed to the upper surface 33 of the moveable member by means of a mounting plate 41. In effect the end of the bellows encircles the passage through the member and a region of the surface of the member to which the tuner driving rod is fixed. The other end of the bellows is sealed to the flanged plate 23 adjacent the opening 24 and encircles the opening.

A lower bellows 42 similar to the upper bellows is sealed at one end to the lower surface 34 of the moveable member 30 by means of a mounting plate 43. In effect the end of the bellows encircles the passage through the member. The other end of the lower bellows is sealed to an impervious member 44. This member is attached to the body of the magnetron by a supporting plate 45 through which there are openings to permit passage of the tuning pins. The two bellows flex, one of them being lengthened while the other is being shortened, to permit reciprocal movement of the moveable member for a limited distance in the region between the opening 24 and the impervious member 44.

The actuator 48 which drives the tuner is mounted on a plate 49 fixed to the cylindrical sleeve 21 of the body. A cylindrical permanent magnet 50 and two magnet pole pieces 51 and 52 are mounted within the actuator housing 53. The inner pole piece 51 and the outer pole piece 52 direct the magnetic field from the magnet 50 across a cylindrical gap concentric with the axis of the device.

A cylindrical electrical coil 55 is positioned within the gap between the pole pieces. The coil 55 is mounted on a support 56 which is secured to the tuner driving rod 35. The tuner driving rod 35 is mounted centrally of the inner magnet pole piece 51 by suitable bushings which permit reciprocal movement of the rod in the direction of the axis of the device. Lead wires 57 to the coil pass through an opening in the inner pole piece.

The tuning apparatus includes a two part transducer 60 which is employed to sense the position of the tuning pins 31 with respect to the cavity resonators. A first or outer element 61 of the transducer is essentially a transformer having input leads to a primary winding and output leads from a secondary winding. The second or inner element 62 of the transducer is the moveable core of the transformer. The voltage produced at the output leads of the transducer is dependent on the input voltage applied to the input leads and the position of the inner element with respect to the outer element. The outer element 61 of the transducer is mounted on the inner magnet pole piece 51 and the inner element 62 is fixedly mounted on the tuner driving rod 35.

Under operating conditions a bridge circuit (not shown) is employed in conjunction with the tuning system of the magnetron. The input tuning signals are applied to one arm of the bridge circuit and the output signal from the transducer is applied to another arm. An output signal is taken from another arm of the bridge circuit, amplified, and applied as the input to the electrical tuning coil 55. When the bridge circuit is in an unbalanced condition by virtue of an input tuning signal, an output signal from the bridge circuit is transmitted to the coil. Since the coil is in a magnetic field, the coil moves along the direction of the axis of the magnetron carrying the other moveable elements of the tuning mechanism with it.

The direction of movement of the coil is such as to carry the inner element 62 of the transducer toward a position which will change the output voltage of the transducer to a value which balances the bridge circuit. When the inner element of the transducer is in position and the bridge circuit balanced, the electrical signal from the bridge circuit to the coil terminates. The driven elements of the tuning mechanism including the inner element 62 of the transducer and the tuning pins 31 remains at the position to which they have been moved. In this manner the position of the tuning pins with respect to the cavity resonators is changed by the application of electrical tuning signals to an arm of the bridge circuit, thereby tuning the output frequency of the magnetron.

During actuation of the tuning mechanism to move the tuning pins in one direction, one of the two bellows 40 and 42 which are arranged in series is lengthened while the other is shortened. All portions of the central space within the body of the device bounded by the two bellows 40 and 42, the impervious member 44, and the walls of the passages 32 through the moveable member are open to each other and to the exterior atmosphere by way of the opening 24. Therefore, the moveable tuning member 30 which is the only moving element, except for portions of the bellows, having surfaces both within and exterior of the evacuated chamber has equal pressure on the two opposed surfaces 33 and 34 normal to the direction of movement providing a balanced condition. Regardless of the position of the moveable member, the volume of the evacuated chamber remains substantially constant. Thus, with the structure described none of the energy of the tuner driving system is employed to expand the volume of an evacuated chamber against the force of atmospheric pressure acting on a moveable member which has surfaces both within and exterior of the chamber. Although these advantages are of particular significance in permitting the use of tuner driving mechanisms such as the electromagnetic system illustrated, the tandem bellows arrangement of the invention is also found useful in other tuning systems for resonant cavity devices, such as hydraulically driven or manually operated systems.

A modification of the invention is shown in FIG. 2 embodied for purposes of illustration in a coaxial magnetron. The magnetron includes a block 65 which constitutes a portion of the body of the device. An anode member 66 positioned centrally of the block has a plurality of vanes 67 extending radially inward to provide a plurality of cavity resonators lying in a circular array about the central axis of the device. Vertical slots 68 in the anode couple electrical energy from the resonant cavities of the anode to a stabilizing resonant cavity 69 encircling the anode.

An electron emissive cathode 70 is positioned centrally of the anode and spaced from the tips of the vanes. Upper and lower magnet pole pieces 71 and 72 are arranged to direct a magnetic field from permanent magnets (not shown) through the interaction space between the anode and the cathode. The cathode passes through a bore (not shown) in the lower pole piece. The cathode, the anode, and the stabilizing cavity are within a sealed, evacuated chamber 73. The lower end of the chamber is hermetically sealed by a suitable sealing arrangement between the block, lower pole piece, and cathode. Electromagnetic energy is coupled from the magnetron by an output coupler 74 extending through the block and communicating with the stabilizing cavity.

The upper pole piece 71 is encircled by a flange 77 which is sealed to the upper edge of the block 65. The flange is sealed to a body member 78 which in turn is sealed to a plate 79. An opening 80 in the plate 79 is located along the central axis of the magnetron. The block 65, flange 77, body member 78, and plate 79 constitute the major portion of the walls of the chamber 73 and the opening 80 provides access to the chamber for the tuner mechanism.

Within the chamber 73 the tuning mechanism includes a tuning ring 83 having a plunger or surface 84 which forms the upper wall of the stabilizing resonant cavity 69. The tuning ring is fixed to a tuning ring support 85 which has legs passing through openings in the upper pole piece 71. The support is fixed to a moveable tuning member 86 at a central portion 87 which extends through the opening 80 in the plate 79. Movement of the moveable tuning member along the direction of the axis of the device causes the tuning ring 83 to move with respect to the other walls of the stabilizing cavity thereby increasing or decreasing the size of the cavity and consequently changing the frequency of resonance of the cavity.

The opening 80 in the walls defining the evacuated chamber 73 is sealed by the moveable tuning member 86 and other elements of structure so as to permit reciprocal movement of the moveable member along the direction of the axis of the device. The lower surface 88 of the moveable tuning member 86 which faces the opening 80 is sealed to the upper end of a cylindrical, flexible bellows 90. The lower end of the bellows is sealed to the plate 79 adjacent the opening 80 and encircles the opening.

The lower end of an upper bellows 91 similar to the lower bellows is sealed to the upper surface 92 of the moveable tuning member opposite the lower surface 88. The upper end of the upper bellows 91 is sealed to a plate 93 which together with a cylinder 94 and plate 95 sealed thereto provides an impervious member which faces the upper surface of the moveable member and seals the end of the bellows. The plate is fixed in position with respect to the body of the magnetron.

A passage 96 extends through the central region of the moveable tuning member 86 between the opposed upper and lower surfaces 92 and 88 thus connecting the spaces encircled by the two bellows and exposing both surfaces to the atmosphere of the chamber. The lower end of the upper bellows 91 encircles the passage, and the upper end of the lower bellows 90 in effect encircles the passage and the surface region of the central portion 87 of the moveable member to which the tuning ring support 85 is fixed.

The tuner actuator 100 for driving the tuner is mounted on a sleeve 101 attached to the body of the magnetron. The housing for the actuator includes a plate 102, a cylinder 103, and a member 104. A cylindrical permanent magnet 105 is mounted within the actuator housing. The magnetic field from the magnet is directed by an outer pole piece 106 and by inner pole pieces 107, 108, and 109 across a cylindrical gap concentric with the axis of the device. The impervious member 93 sealing the upper end of the upper bellows 91 is secured to the magnet pole piece 109.

A cylindrical electrical coil 110 is positioned within the gap between the pole pieces. The coil is mounted on a supporting sleeve 111 which is secured to the outer periphery of the moveable tuning member 86 between the two opposed surfaces 88 and 92. Supporting legs 112 from the sleeve pass through openings in the inner pole piece 108 and are fixed to a tuner rod 115 disposed along the axis of the magnetron. The supporting sleeve 111 and rod 115 are positioned within the sleeve 101 and inner pole piece 108, respectively, by alignment bushings 116, and 117 and 118 which permit reciprocal movement of the moveable tuning elements in the direction of the axis of the device. Lead wires 120 to the coil pass through openings in the inner pole piece and the housing.

The outer element 121 of a two-part transducer is mounted centrally of the magnetron on the member 104 of the tuner actuator housing. The inner element 122 of the transducer is fixed to the upper end of the tuner rod 115.

The tuning system described operates in conjunction with a bridge circuit (not shown) in a manner similar to the embodiment of FIG. 1. An electrical signal applied to the coil 110 causes the coil to move along the direction of the axis of the magnetron carrying the moveable tuning member 86, tuning ring 83, and inner element 122 of the transducer with it. The resonant frequency of the stabilizing cavity 69 is altered by a change in the position of the tuning ring thereby changing the output frequency of the magnetron.

As the tuner mechanism is actuated to move the tuning ring in one direction, one of the two series mounted bellows 90 and 91 is lengthened while the other is shortened. All portions of the central space bounded by the two bellows 90 and 91, the impervious member 93, and the walls of the passage 96 through the moveable member are open to each other and to the major section of the chamber 73 by way of the opening 80. Therefore, the moveable tuning member 86, which is the only moving element, except for portions of the bellows, having surfaces both within and exterior of the evacuated chamber, has equal pressure on the two opposed surfaces 88 and 92 normal to the direction of movement. Regardless of the position of the moveable member, the volume of the evacuated chamber remains substantially constant. Thus, it is not necessary for the tuner driving system to supply energy to expand the volume of an evacuated chamber against the force due to atmospheric pressure acting on a moveable member having surfaces both within and exterior of the chamber.

What we claim is:

1. A tunable resonant cavity device including in combination:

a body having walls enclosing a sealed chamber;

a cavity resonator located with said chamber;

a portion of said chamber encircling a central space exposed to exterior atmosphere through an opening in said walls centrally of said body at one end of the central space;

said central space being sealed from said chamber by structure including:

an atmosphere impervious member spaced from the opening in the body at an end of the central space opposite said opening and fixed to said body, a moveable member having two opposed surfaces, said moveable member located intermediate said opening and said impervious member and having one of said opposed surfaces facing said opening and the other opposed surface facing said impervious member, a first surface region at the periphery of said moveable opposed surfaces, said two opposed surfaces lying within said chamber, said moveable member having a passage therethrough between said two opposed surfaces, a first cylindrical bellows having one end encircling said opening in said body and sealed to said walls and having the other end encircling said passage and a second surface region of said moveable member and sealed to said one opposed surface, and a second cylindrical bellows having one end encircling said passage in said moveable member and sealed to the other opposed surface and having the other end sealed to said impervious member whereby said moveable member is permitted to move reciprocally for a limited distance in the region between the opening and the impervious member without substantially changing the volume of said sealed chamber;

a tuning element within the chamber fixed to said first surface region at a periphery of said moveable member and adapted to be moved with respect to said body to change the resonant frequency of the cavity resonator; and a tuner driving member extending through said opening and said first bellows and affixed to said moveable member.

2. The invention as defined in claim 1 further comprising:

means for producing a magnetic field fixed with respect to said body; and electrical coil means mounted in said magnetic field and fixed to said tuner drive member for permitting the flow of electrical current in said coil to cause said coil to move with respect to said magnetic field means, thereby moving the tuner drive member, the moveable member, and the tuning element and causing one of said bellows to lengthen and the other to shorten so that as the resonant frequency of said resonant cavity device is changed, the volume of the chamber remains substantially constant.

3. A tunable magnetron including in combination:

a body having walls enclosing an evacuated chamber;

a resonant cavity structure within said chamber;

a tuning element within the chamber adapted for reciprocal movement with respect to said resonant cavity structure to alter the resonant frequency of the magnetron, said walls having an opening therein, an atmosphere impervious member spaced from said opening and affixed to said body, a moveable member having two opposed surfaces and a first surface region between said two opposed surfaces and being located intermediate said opening and said impervious member, said moveable member having a passage extending therethrough for equalizing pressure between said two opposed surfaces, and a second surface region on one of said two opposed surfaces, a first cylindrical bellows having one end encircling said opening and sealed to said walls and having the other end encircling said passage and said second surface region of the moveable member and sealed to said one of said opposed surfaces of said moveable member, a second cylindrical bellows having one end encircling said passage in said moveable member and sealed to the other of said opposed surfaces of said moveable member and having the other end thereof sealed to said impervious member whereby as the moveable member is moved between said opening and said impervious member the volume of the space between the opening and the impervious member encircled by the first and second bellows remains substantially constant, said tuning element being affixed to said moveable member at said second surface region within said chamber, a tuner drive member fixed to said first surface region of said moveable member exterior of the chamber, means for producing a magnetic field fixed with respect to said body, and an electrical coil means mounted in said magnetic field and fixed to said tuner drive member for permitting the flow of electrical current in said coil to cause said coil to move with respect to said magnetic field means thereby moving the tuner drive member, the moveable member, and the tuning element and causing one of said bellows to lengthen and the other to shorten so that as the resonant frequency of the magnetron is changed the volume of the chamber remains substantially constant.

4. In a tunable resonant cavity device containing an evacuated sealed cavity and a tuning element for varying the resonant frequency of said cavity located within said cavity, tuner driver means located outside said cavity, and means for coupling mechanical movement from said tuner driver means exterior of said cavity to said tuning element in the interior of said evacuated cavity without permitting the exterior atmosphere from entering said cavity comprising: a generally flexible deformable closed body enclosing a predetermined volume and having a first and second end; means anchoring said first end of said body at a first fixed location and said second end of said body at a second fixed location spaced from said first, an opening at said first end of said deformable body; means at said first end about said opening for sealing said evacuated cavity from the exterior thereof; first mechanical coupling means connected at a predetermined internal location between said ends along said deformable body for transmitting a force in a direction between said ends; second mechanical coupling means connected to an external location between said ends along said deformable body for transmitting a force in a direction between said ends; said first mechanical coupling means extending through said opening; and, means coupling said tuner driver means to one of said coupling means; and, means coupling said tuning element in said cavity to the other of said coupling means, whereby as said tuner driving means compresses one portion of said deformable body it simultaneously expands another portion thereof maintaining the total volume enclosed by said deformable body substantially constant; whereby any pressure difference between the interior and exterior of said cavity does not result in a force on said tuner driver means.

5. The invention as defined in claim 4 wherein said flexible deformable body further comprises: a nondeformable moveable member mechanically connected in series between a first and a second hollow deformable body portions of substantially equal length; a passage extending through said moveable member for equalizing pressures on each side thereof within said deformable body; and wherein said second coupling means is connected to said deformable body at the outer periphery of said movable means; and said first coupling means is connected to said deformable body internally thereof at said moveable member.

6. The invention as defined in claim 5 wherein said first and second deformable body portions comprise a first and second bellows.

7. The invention as defined in claim 6 wherein said tuner driver means is electromagnetically actuated and includes a current carrying coil and means for establishing a static magnetic field between the inside and the outside peripheries of said coil.

8. Apparatus comprising an evacuated tunable cavity tunable by at least one plunger which is moveable therein wherein the said plunger is carried on a support member which passes through and is slideable within a hole in the cavity wall and is carried by a further member on both sides of which are extensible bellows defining substantially equal effective areas and connecting said further member to two fixed parts, said bellows being extensible substantially only in a direction parallel to the direction of sliding movement of the support member and the whole arrangement being such that the bellows, further member, fixed parts and cavity wall enclose an evacuated space which is in communication only with the evacuated interior of the cavity.

9. Apparatus as claimed in claim 8 wherein the bellows are similar, cylindrical and coaxial.

10. Apparatus as claimed in claim 8 wherein mechanical adjustment means, attached to the further member outside the bellows, are provided for mechanically moving said further member in the direction of sliding movement of the support member or members.

11. Apparatus comprising an evacuated tunable cavity having plunger means movable therein for tuning of said cavity, movable support means connected to said plunger means, extensible bellows means for sealing said evacuated cavity and maintaining said movable support means in an unbiased condition, said bellows means connecting said support means to two fixed parts, said bellows means, support means and two fixed parts defining an evacuated space in communication with said evacuated cavity.

12. Apparatus comprising an evacuated tunable cavity tunable by at least one tuning means which is movable therein wherein the said tuning means is carried on a support member which passes through and is movable within a passage in the cavity wall and is carried by a further member on both sides of which are extensible bellows defining substantially equal effective areas and connecting said further member to two fixed parts, said bellows being extensible substantially only in a direction parallel to the direction of movement of the support member and the whole arrangement being such that the bellows, further member, fixed parts and cavity wall enclose on either the inside or outside of the walls of said bellows an evacuated space which is in communication with the evacuated interior of the cavity.

13. Apparatus as claimed in claim 12 wherein the bellows are similar, cylindrical and coaxial.

14. Apparatus as claimed in claim 12 wherein there is a plurality of tuning means each carried by a support member comprising a rod which is movable endwise in a passage in the cavity wall, the rods being carried by said further member, said further member comprising an annular plate and the two bellows connecting opposite faces of said plate to said two fixed parts, said two fixed parts comprising further plates, one on either side of the annular plate and parallel thereto.

15. Apparatus as claimed in claim 12 wherein mechanical adjustment means, attached to the further member, are provided for mechanically moving said further member in the direction of movement of the support member or members.

16. Apparatus comprising an evacuated tunable cavity having tuning means movable therein for tuning of said cavity, movable support means connected to said tuning means, extensible bellows means for sealing said evacuated cavity and maintaining said movable support means in an unbiased condition, said bellows means connecting said support means to two fixed parts, said bellows means, support means, and two fixed parts defining on either the inside or outside of the walls of said bellows an evacuated space in communication with said evacuated cavity.